(12) United States Patent
Kang

(10) Patent No.: US 7,768,827 B2
(45) Date of Patent: Aug. 3, 2010

(54) DATA VERIFICATION METHOD AND SEMICONDUCTOR MEMORY

(75) Inventor: Dong-ku Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 127 days.

(21) Appl. No.: 12/017,412

(22) Filed: Jan. 22, 2008

(65) Prior Publication Data

US 2008/0212368 A1 Sep. 4, 2008

(30) Foreign Application Priority Data

Jan. 23, 2007 (KR) .................. 10-2007-0007245

(51) Int. Cl.
*G11C 11/34* (2006.01)
(52) U.S. Cl. .................. 365/185.03; 365/185.12; 365/185.2; 365/185.22; 365/185.33
(58) Field of Classification Search ............ 365/185.03, 365/185.22, 185.33, 185.12, 185.2
See application file for complete search history.

(56) References Cited

U.S. PATENT DOCUMENTS

| | | | | |
|---|---|---|---|---|
| 5,638,326 A | * | 6/1997 | Hollmer et al. ......... | 365/185.2 |
| 5,712,815 A | * | 1/1998 | Bill et al. ............. | 365/185.03 |
| 5,835,414 A | * | 11/1998 | Hung et al. ............. | 365/185.12 |
| 6,021,069 A | * | 2/2000 | Hung et al. ............. | 365/185.22 |
| 6,304,486 B1 | * | 10/2001 | Yano ................... | 365/185.22 |
| 6,801,457 B2 | * | 10/2004 | Tanzawa et al. ........ | 365/185.22 |
| 7,038,950 B1 | * | 5/2006 | Hamilton et al. ....... | 365/185.22 |
| 7,139,192 B1 | * | 11/2006 | Wong .................. | 365/185.03 |
| 7,154,784 B2 | * | 12/2006 | Lee ................... | 365/185.12 |
| 7,242,615 B2 | * | 7/2007 | Nagashima ............ | 365/185.22 |
| 7,324,374 B2 | * | 1/2008 | Shieh et al. ........... | 365/185.03 |
| 7,336,532 B2 | * | 2/2008 | Chen .................. | 365/185.03 |
| 7,426,138 B1 | * | 9/2008 | Wong .................. | 365/185.03 |
| 7,539,067 B2 | * | 5/2009 | Maejima .............. | 365/185.22 |
| 7,561,467 B2 | * | 7/2009 | Kang et al. ........... | 365/185.03 |
| 7,564,724 B2 | * | 7/2009 | Park .................. | 365/185.2 |

FOREIGN PATENT DOCUMENTS

| | | |
|---|---|---|
| JP | 2000276887 | 10/2000 |
| JP | 2004118940 | 4/2004 |
| JP | 2005149593 | 6/2005 |
| KR | 1020010017413 A | 3/2001 |

* cited by examiner

*Primary Examiner*—Trong Phan
(74) *Attorney, Agent, or Firm*—Volentine & Whitt, PLLC

(57) ABSTRACT

A semiconductor memory device storing multi-bit write data and a related method of verifying data programmed to a memory cell are disclosed. The method compares a write data reference bit selected from the write data with a corresponding external data bit indicative of an intended write data bit value, and verifies a target bit selected from the write data only upon a positive comparison between the write data reference bit and the corresponding external data bit.

8 Claims, 6 Drawing Sheets

DATA VERIFICATION METHOD AND SEMICONDUCTOR MEMORY

CROSS-REFERENCE TO RELATED PATENT APPLICATION

This application claims priority to Korean Patent Application No. 10-2007-0007245 filed on Jan. 23, 2007, the subject matter of which is hereby incorporated by reference.

BACKGROUND OF THE INVENTION

1. Field of the Invention

The present invention relates to a data verification method operative within a semiconductor memory device. More particularly, the invention relates to a data verification method and semiconductor memory device for selectively verifying data written in a memory cell based on a data value.

2. Description of Related Art

Non-volatile memory devices capable of performing electrical erasing and programming operations may preserve data even when electrical power is interrupted. Flash memory is one representative example of contemporary non-volatile memory devices.

Each memory cell in a flash memory comprises a cell transistor including a control gate, a floating gate, a source, and a drain. The cell transistor is programmed or erased using an electrical charge transfer mechanism called Fowler-Nordheim (F-N) tunneling.

An erase operation for the cell transistor is performed by applying a ground voltage to the control gate and a voltage higher than the source voltage to the constituent semiconductor substrate or transistor bulk. Under this erase bias condition, a strong electric field is formed between the floating gate and bulk due to a large voltage difference between these two elements, thus electrons stored on the floating gate migrate to the bulk due to the F-N tunneling effect. In this case, the threshold voltage of the erased cell transistor is changed in a negative direction.

A program operation for the cell transistor is performed by applying a voltage higher than the source voltage to the control gate and applying ground voltage to the drain and bulk. Under this program bias condition, electrons are injected onto the floating gate of the cell transistor due to the F-N tunneling effect. In this case, the threshold voltage of the programmed cell transistor is changed in a positive direction.

FIG. 1 is a collection of related diagrams further illustrating the general structure and operation of a memory cell in a conventional non-volatile memory device.

Referring to FIG. 1, and continuing with the working example described above, electrons are accumulated on the floating gate FG of the memory cell during a program operation, and are removed from the floating gate FG during an erase operation. As a result, the threshold voltage of the memory cell transistor following a program operation is greater than 0V, but is less than 0V following an erase operation.

Recently, much research has been conducted in regard to multi-level flash memory in which a plurality of data bits (i.e., two or more) are stored in a single memory cell in order to improve integration of flash memory. A memory cell storing the multi-bit data is referred to as a multi-level cell. On the other hand, a memory cell storing a single bit data is referred to as a single-level cell. A multi-level cell stores multi-bit data using two or more threshold voltage distributions corresponding to two or more data storage states. A case where two-bit data is stored in the multi-level cell is illustrated in FIG. 2, wherein single bit data stored in a single-level cell is illustrated in FIG. 1. However, three or more bits of data may be stored in the multi-level cell.

A conventional multi-level cell storing the two-bit data is capable of being programmed into one of four data states which correspond to stored data values of 01, 10, and 00. The data state corresponding to a stored data value of 11 is commonly designated as an erase state, whereas the data states corresponding to 10, and 00 are programmed states.

Voltage levels associated with the four data states correspond to threshold voltage distributions for the multi-level cell. For example, assuming the threshold the data states 11, 01, 10, and 00 correspond to the threshold voltage distributions VTH1~VTH2, VTH3~VTH4, VTH5~VTH6, and VTH7~VTH8, respectively. That is, a threshold voltage of the multi-level cell corresponds to one of the threshold voltage distributions VTH1~VTH2, VTH3~VTH4, VTH5~VTH6, and VTH7~VTH8, and two-bit data corresponding to one of the data states 11, 01, 10, and 00 is stored in the multi-level cell.

The diagrams shown in FIG. 2 further illustrates the programming of multiple data states ($1^{st}$ through $4^{th}$) in relation to respective electron accumulations on a floating gate FG formed between a transistor bulk (e.g., a P+ substrate) and a control gate CG. N+ of FIG. 2 illustrates source or drain of a cell transistor. FIG. 3 is a related graph illustrating changes in threshold voltage distributions in relation to a multi-level cell.

Referring FIG. 2, an erase (or first) state is defined as one in which few (e.g., a practical minimum) electrons are accumulated on the floating gate FG of the multi-level cell. The various program states (second through fourth) are defined by progressively more electrons accumulated on the floating gate FG. As the quantity of charge accumulates on the floating gate FG, the threshold voltage of the multi-level cell increases. Thus, the threshold voltage distributions for the multi-level cell increase from the erase state through the various program states in accordance with the quantity of charge accumulated on the floating gate.

As is well understood in the art, once multi-bit data has been written to a multi-level cell, said data must be verified. That is, the actual threshold voltage of the multi-level cell is verified following a program operation to determine whether it is consistent with an intended data state.

In the example illustrated in FIG. 3, multi-bit data (e.g., 4-bit data) is stored in a multi-level cell and may be verified by using reference threshold voltage levels a1, a3, a5, a7, a9, a11, a13, a15, b1, b3, b5, b7, b9, b11, b13, and b15. These reference threshold voltage levels are disposed in relation to defined threshold voltage distributions for the multi-level cell and may be used to determine whether an actual threshold voltage is consistent with an intended data state. For example, if write data (i.e., data intended to be stored in a multi-level memory cell) is 0001, it must be determined whether the actual threshold voltage for the multi-level cell following the incident program operation is properly established between the reference threshold voltage levels a7 and b7.

However, in a conventional approach to programmed data verification, the threshold voltage of the multi-level cell must be sequentially compared to all of the reference threshold voltages. Thus, in the example illustrated in FIG. 3, the actual threshold voltage of the multi-level cell must be compared all sixteen (16) reference threshold voltage levels a1, a3, a5, a7, a9, a11, a13, a15, b1, b3, b5, b7, b9, b11, b13, and b15. Thus, as the number of data bits in the programmed data rises and the corresponding number of reference threshold voltages rises accordingly, the conventional approach to verifying an actual threshold voltage increases dramatically. At some point, depending on related memory system performance characteristics and requirements, this conventional approach will fail to operate sufficiently fast to allow effective data verification.

SUMMARY OF THE INVENTION

Embodiments of the invention provide a data verification method for selectively and adaptively verifying write data in a multi-bit memory cell based on the value of the write data.

Embodiments of the invention also provide a semiconductor memory device capable of selectively and adaptively verifying write data in a multi-bit memory cell by selectively activating a page buffer in relation to the value of the write data.

In one embodiment, the invention provides a method of verifying multi-bit write data programmed to a multi-level memory cell, method comprising; comparing a write data reference bit selected from the write data programmed to the memory cell with a corresponding external data bit indicative of an intended write data bit value, and verifying a target bit selected from the write data excluding the write data reference bit only upon a positive comparison between the write data reference bit and the corresponding external data bit.

In another embodiment, the invention provides a method of verifying N-bit write data programmed to a multi-level memory cell, method comprising; comparing M write data reference bits selected from the N-bit write data programmed to the memory cell, where M is less than N, with a corresponding M external data bits, and verifying P target bits selected from the write data excluding the write data reference bit, where M+P is equal to N, (wherein N, M and P are natural numbers) only upon a positive comparison between the M write data reference bits and the corresponding M external data bits.

In another embodiment, the invention provides a semiconductor memory device comprising; a multi-level memory cell, and a page buffer configured to program write data to and read programmed data from the memory cell, wherein the page buffer is further configured to conditionally perform a write data verification in relation to a target bit selected from the write data in relation to a comparison between a write data reference bit selected from the write data and a corresponding external data bit indicative of an intended write data value.

DESCRIPTION OF EMBODIMENTS

Embodiments of the invention will now be described with reference to the accompanying drawings. Throughout the drawings and written description, like reference numbers and indicators are used to denote like or similar elements. The illustrated embodiments are presented at teaching examples while the scope of the invention is defined by the attached claims.

Figure 4:
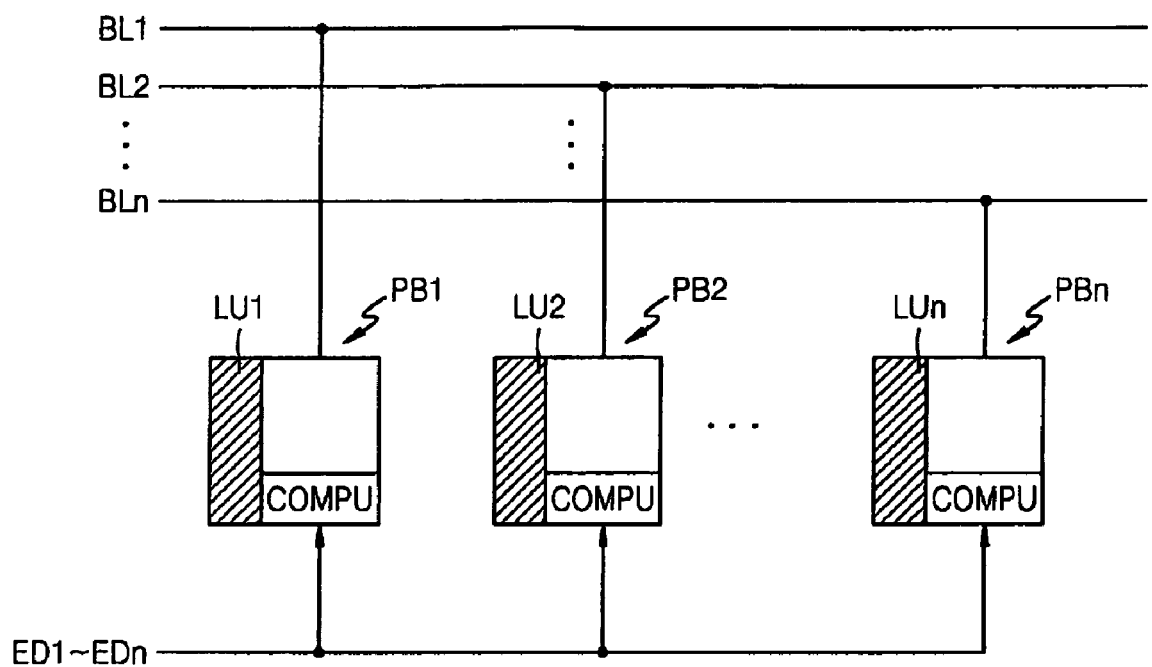
FIG. 4 is a schematic diagram of a semiconductor memory device capable of selectively verifying write data in relation to the value of the write according to an embodiment of the invention.

FIG. 4 is a schematic diagram of a semiconductor memory device capable of selectively verifying write data in a multi-level memory cell in relation to the value of the write data consistent with an embodiment of the invention.

Referring to FIG. 4, the semiconductor memory device includes one or more memory cells (not shown) connected to a corresponding bit line among a plurality of bit lines BL1-BLn and arranged in relation to a plurality of page buffers PB1-PBn. Each of the page buffers PB1-PBn comprises a corresponding latch unit among a plurality of latch units LU1-LUn. Where write data (e.g., one or more bits of write data) written to the memory cells is identical to external data ED1-EDn applied to the plurality of the page buffers PB1-PBn, the write data is verified within plurality of the page buffers PB1-PBn. Thus, the external data ED1-EDn will have the same number of bits as the number of write data bits programmed by each one of the plurality of the page buffers PB1-PBn.

In contrast, if the write data is not identical to the corresponding external data ED1-EDn, the plurality of page buffers PB1-PBn will not verify the write data. Write data verification may be made in relation to one or more bits of write data. For example, when the three lower (i.e., less significant) bits of 4-bit write data are compared to external data ED1-EDn and found to be identical to three corresponding bits of external data ED1-EDn, then the fourth (i.e., the most significant bit—MSB) of the 40 bit write data may be effectively verified in terms of whether it has been correctly programmed to the memory cell. On the other hand, if the three lower bits are not identical to the corresponding external data ED1-EDn, the verification of the MSB need not be performed.

Figure 5:
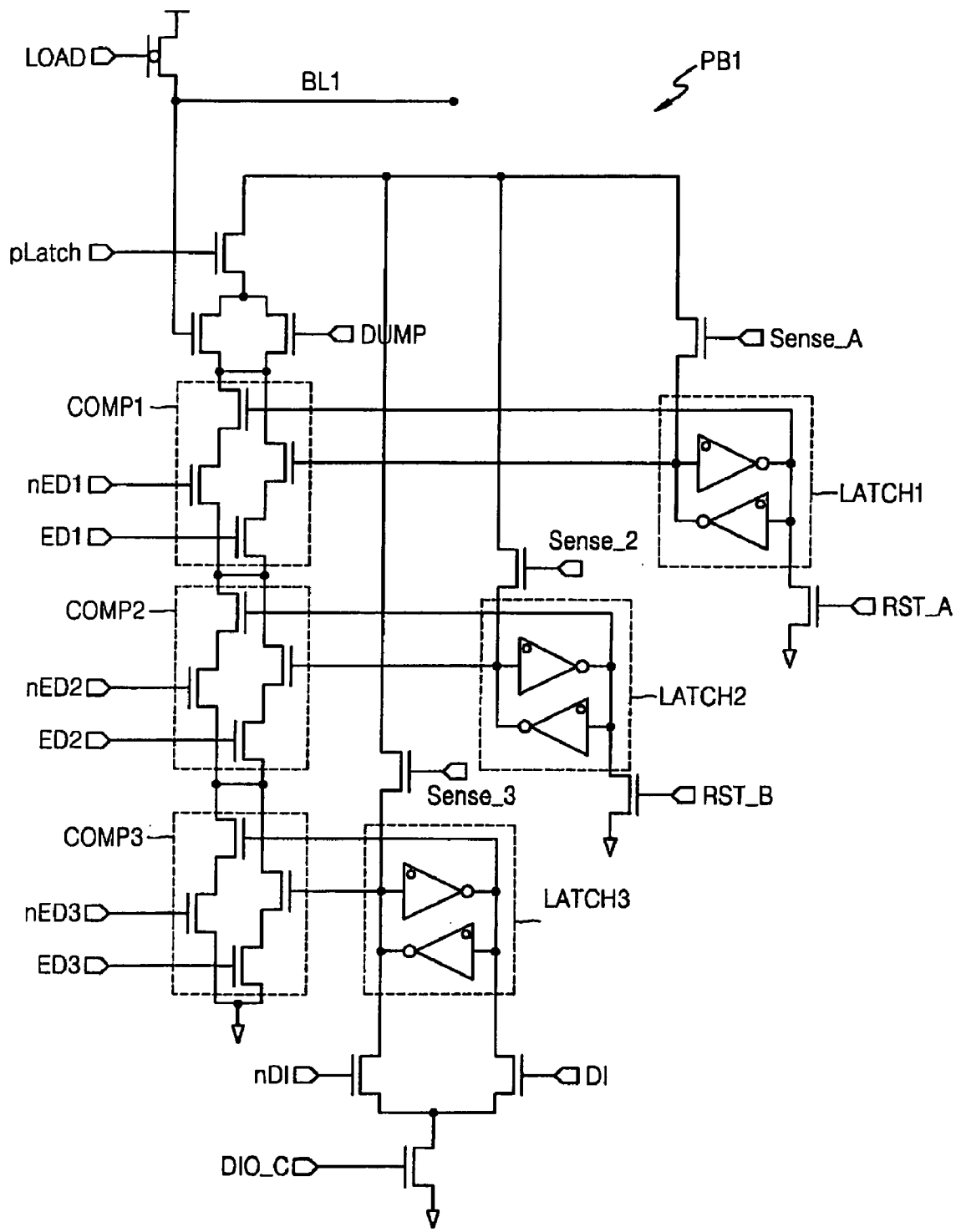
FIG. 5 is a circuit diagram of a page buffer operative within the semiconductor memory device illustrated in FIG. 4 according to an embodiment of the invention.

FIG. 5 is a circuit diagram further illustrating one of the plurality of page buffers operative within the semiconductor memory device of FIG. 4 according to an embodiment of the invention. In FIG. 5, the page buffer PB1 illustrated in FIG. 4 will be exemplarily described.

As indicated in FIG. 4, each one of the plurality of page buffers comprises a latch unit LU and a comparison unit COMPU. The latch unit LU generally latches certain "write data reference bits" from the write data being written to a corresponding multi-level memory cell. The one or more bits of write data not designated as write data reference bits are termed the target write data bit(s). The comparison unit COMPU compares, bit-for-bit, the write data reference bits stored in a corresponding latch unit LU with a corresponding number external data bits ED1-EDn. LOAD of FIG. 5 is the signal for precharging of the first page buffer PB1, pLatch of FIG. 5 is the signal for storing the voltage of the bit line BL1 to the first through third latches LATCH1-LATCH3, DUMF of FIG. 5 is the signal for dumping out data from one latch among the first through third latches LATCH1-LATCH3 to other latch among the first through third latches LATCH1-LATCH3, nDI and DI of FIG. 5 are the signal for inputting data to the first page buffer PB1, DIO C of FIG. 5 is the signal for decoding address in connection with the selection of the first page buffer PB1, Sense A, Sense 2 and Sense 3 of FIG. 5 are the signal for enabling the corresponding latch, RST A and RST B of FIG. 5 are the signal for resetting the corresponding latch, and nED1, nED2 and nED3 of FIG. 5 are the signal having the contrary logic level to the logic level of the corresponding signal among external data bits ED1-EDn.

FIG. 5 further illustrates a first latch unit LU1 and a first comparison unit COMPU1 within first page buffer PB1 of FIG. 4. In the working example of FIG. 5, first latch unit LU1 and first comparison unit COMPU1 are assumed to operate in relation to three (3) write data reference bits to gate (enable/disable) the operation of a verification operation in relation to a single target write data bit. Thus, first latch unit LU1 comprises first through third latches LATCH1-LATCH3, respectively associated with and storing the three write data reference bits. First comparison unit COMPU1 similarly comprises first through third comparators COMP1-COMP3, respectively comparing one write data reference bit with a corresponding bit of external data ED1-EDn.

In page buffer PB1 each comparator is arranged to receive complementary external data signals (e.g., ED1 and nED1) and latched data from a corresponding latch (e.g., LATCH1). The data bits stored in the plurality of latches may be read from the corresponding memory cell. As is conventional, first page buffer PB1 may also write the write data to a corresponding memory cell.

According to the illustrated embodiment of FIG. 5, first page buffer PB1 is capable of enabling or disabling a subsequently applied write verification operation related to the target bit (e.g., the MSB) stored in the memory cell in relation to the three write data reference bits compared in the first comparator COMPU1.

Figure 6:
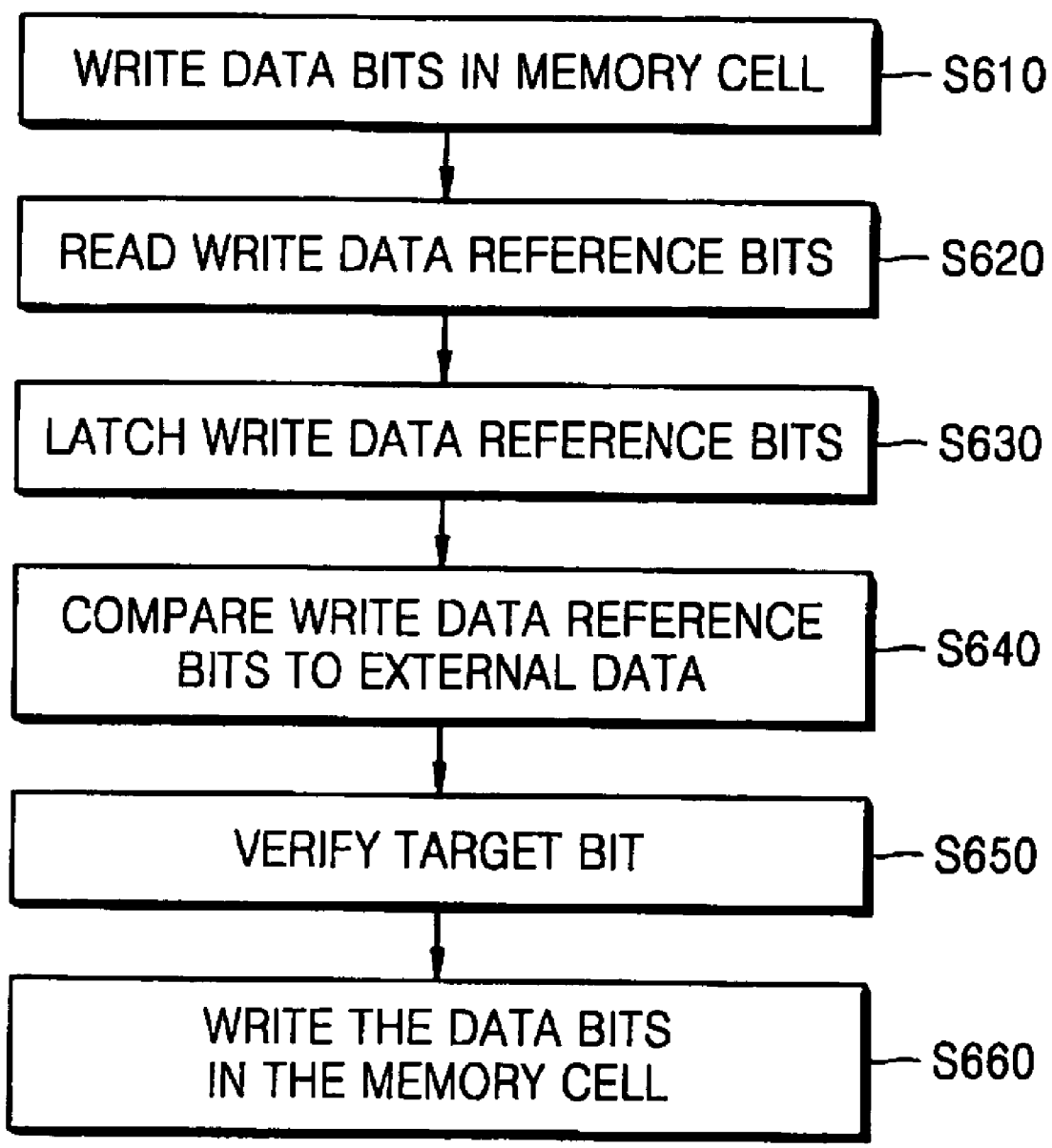
FIG. 6 is a flowchart summarizing a data verification method for selectively verifying write data in relation to its value according to an embodiment of the invention.

FIG. 6 is a flowchart summarizing a data verification method for selectively verifying multi-level write data written in a memory cell in relation to the value of the data according to an embodiment of the invention.

In the illustrated data verification method, multi-bit write data is first written in a multi-level memory cell (S610). Thereafter, one or more bits of the write data are read from the memory cell by a corresponding page buffer as write data reference bit(s) (S620). The write data reference bits are then latched in the corresponding page buffer (S630). The latched write data reference bits are then compared to corresponding bits of external data (S640). One or more target bits of write data are then verified, or not, based on the comparison result between the external data bits and the write data reference bits (S650). Assuming a positive comparison between the external data bits and the write data reference bits, the target bit(s) are verified using conventional techniques, and the all bits of the write data are stored in the memory cell (S660). Where the comparison of the external data bits and the write data reference bits is negative (i.e., is not bit for bit identical) the verification operation related to the target bit(s) (S650) is not performed.

Write data bits may be sequentially read and latched in operations S620 and S630 above.

The target bit may be any one or more bits of the write data. The write data reference bits may be any one or more of the write data, except the target bit(s).

Figure 7:
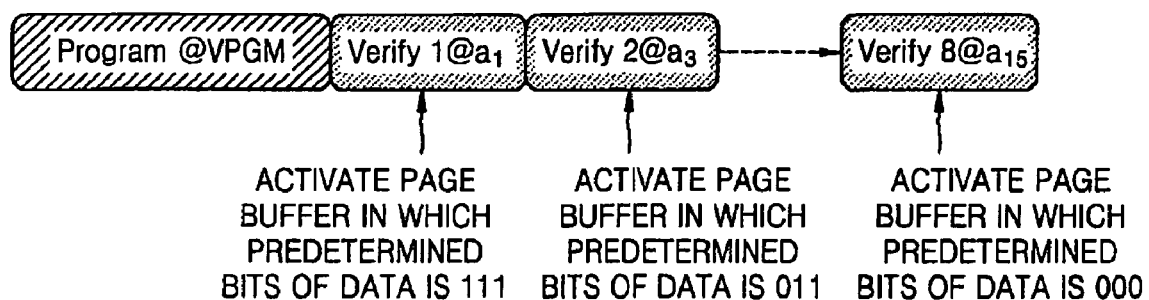
FIG. 7 is a conceptual diagram further describing a data verification method according to an embodiment of the invention.

FIG. 7 is a conceptual diagram further describing a data verification method according to an embodiment of the invention. "Program@PGM" of FIG. 7 illustrates a step of programming the multi-level cell with a program voltage VPGM.

Figure 1:
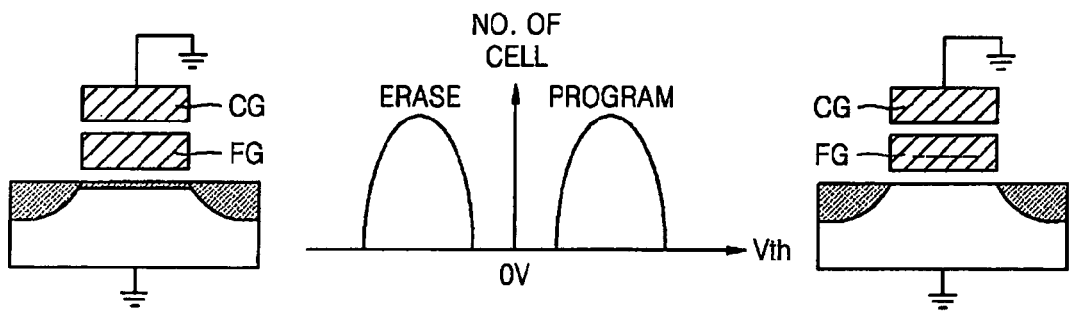
FIG. 1 is a collection of diagrams illustrating the structure and operation of a single bit memory cell in a conventional non-volatile memory device.
Figure 2:
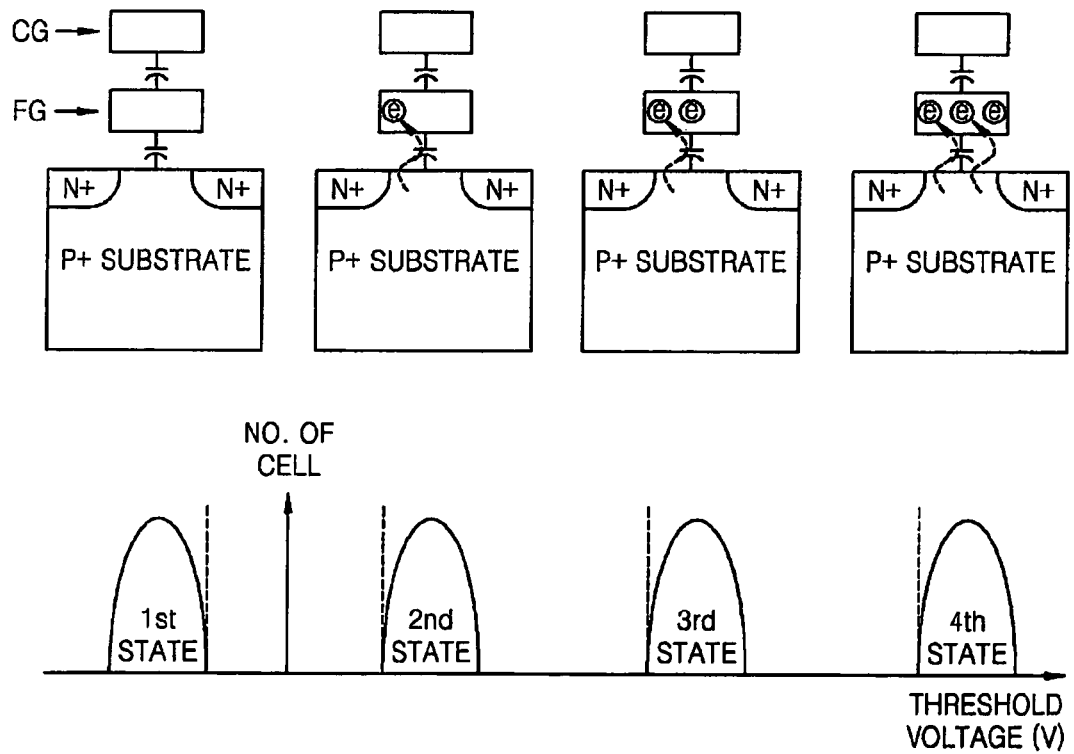
FIG. 2 is a collection of diagrams illustrating the structure and operation of a multi-bit memory cell in a conventional non-volatile memory device.
Figure 3:
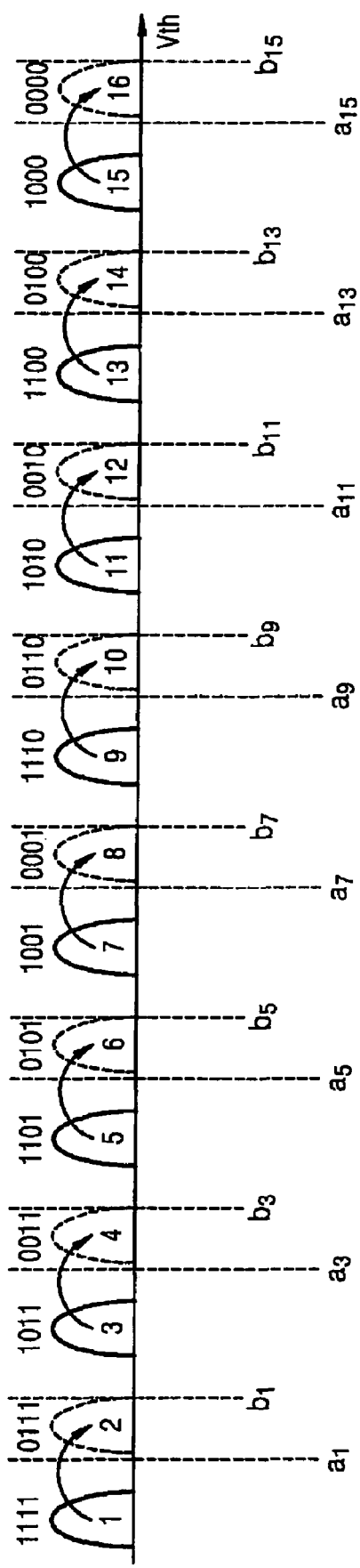
FIG. 3 is a graph illustrating exemplary threshold voltage distributions for a multi-level cell in a conventional non-volatile memory device.

Also, "Verify 1@a1" of FIG. 7 illustrates a step of verifying the threshold voltage distributions 1 of FIG. 3 for the multi-level cell with the reference threshold voltage level a1 of FIG. 3. In the same manner, "Verify 2@a3" illustrates a step of verifying the threshold voltage distributions 2 of FIG. 3 for the multi-level cell with the reference threshold voltage level a3 of FIG. 3, and "Verify 8@a15" of FIG. 7 illustrates a step of verifying the threshold voltage distributions 8 of FIG. 3 for the multi-level cell with the reference threshold voltage level a15 of FIG. 3.

Continuing with the working example of three lower bits of write being used as write data reference bits and further assuming write data reference bit values of 111 stored in a memory cell and corresponding external data values of 111, a fourth and most significant bit of write data is verified. The MSB is verified by comparing threshold voltage distributions of the write data reference bits read from the memory cell to the reference threshold voltage level a1, as shown in FIG. 3. Thus, if the three lower bits of write data read from the memory cell are actually 011, the verification of the target MSB will not proceed beyond the comparison of the threshold voltage distributions of the memory cell to the reference threshold voltage level a1. Only if the write data reference bits faithfully correspond to the corresponding external data will the target bit verification operation proceed through the sequence of reference threshold voltages.

In this manner, a data verification method according to an embodiment of the invention will selectively (or conditionally) proceed forward with a write data verification operation only if the data value(s) associated with selected write data reference bit(s) are consistent with external data which is indicative of an intended write data value.

Figure 8:
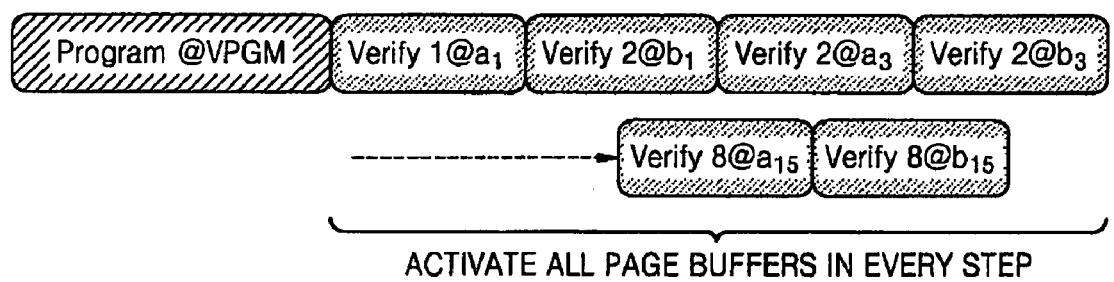
FIG. 8 is a conceptual diagram further describing a data verification method according to a comparative example including an embodiment of the invention.

FIG. 8 is a conceptual diagram further describing a data verification method according to a comparative example including an embodiment of the invention.

Referring to FIG. 8, write data is verified for a memory cell by comparing the data to all the reference threshold voltage levels a1, a3, a5, a7, a9, a11, a13, a15, b1, b3, b5, b7, b9, b11, b13, and b15 (Verify 1@a1, Verify 2@b1, Verify 2@a3, Verify 2@b3, ... , Verify 8@a15, Verify 8@b15).

However, as described above, according to embodiments of the invention, the time required for data verification may be reduced by selectively verifying write data based on its value.

While the present invention has been particularly shown and described with reference to exemplary embodiments thereof, it will be understood by those of ordinary skill in the art that various changes in form and details may be made therein without departing from the scope of the invention as defined by the appended claims. The exemplary embodiments should be considered in a descriptive sense only and not for purposes of limitation. Therefore, the scope of the invention is not limited to only the illustrated embodiments of the invention.

What is claimed is:

1. A method of verifying write data programmed to a memory cell connected to a page buffer, wherein the write data has a plurality of bits, the method comprising:
   comparing a write data reference bit selected from a plurality of bits of the write data to with a corresponding external data bit by the page buffer, wherein the external data bit is a bit of data intended to write to the memory cell; and
   verifying a target bit selected from a plurality of bits of the write data excluding the write data reference bit by the page buffer upon a positive comparison between the write data reference bit and the corresponding external data bit.

2. The method of claim 1, further comprising:

latching the write data reference bit a latch unit within the page buffer; and applying the write data reference bit latched by the latch unit and the corresponding external data bit to a comparison unit located in the page buffer and connected to the latch unit; and comparing the write data reference bit and the corresponding external data bit by the comparison unit.

3. The method of claim 1, wherein verifying the target bit is not performed upon a negative comparison between the write data reference bit and the corresponding external data bit.

4. The method of claim 3, wherein the target bit is a most significant bit or a least significant bit in the write data.

5. The method of claim 1, wherein the memory cell is a non-volatile memory cell.

6. The method of claim 5, wherein the memory cell is a multi-level flash memory cell.

7. A method of verifying write data programmed to a memory cell connected to a page buffer, wherein the write data has N bits and N is a natural number, method comprising:

comparing M write data reference bits selected from the write data by the page buffer, where M is a natural number and less than N, with a corresponding M external data bits; and verifying P target bits, P is a natural number, selected from the write data excluding the write data reference bit by the page buffer, where M+P is equal to N, only upon a positive comparison between the M write data reference bits and the corresponding M external data bits.

8. The method of claim 7, further comprising:

latching the M write data reference bits by a latch unit within the page buffer; and applying the M write data reference bit latched by the latch unit and the corresponding M external data bits to a comparison unit located in the page buffer and connected to the latch unit; and comparing the M write data reference bits and the corresponding M external data bit by the comparison unit.

* * * * *